United States Patent
Roux et al.

(10) Patent No.: US 8,553,205 B2
(45) Date of Patent: Oct. 8, 2013

(54) METHOD FOR CONTROLLING THE POSITION OF A MOVABLE OBJECT, A CONTROL SYSTEM FOR CONTROLLING A POSITIONING DEVICE, AND A LITHOGRAPHIC APPARATUS

(75) Inventors: Stephen Roux, New Fairfield, CT (US); Frederick Michael Carter, New Milford, CT (US); Ross Ian Mackenzie, Cambridge, MA (US)

(73) Assignee: ASML Holdings N.V., Veldhoven (NL)

( * ) Notice: Subject to any disclaimer, the term of this patent is extended or adjusted under 35 U.S.C. 154(b) by 441 days.

(21) Appl. No.: 12/822,370

(22) Filed: Jun. 24, 2010

(65) Prior Publication Data

US 2011/0149263 A1     Jun. 23, 2011

Related U.S. Application Data

(60) Provisional application No. 61/221,853, filed on Jun. 30, 2009.

(51) Int. Cl.
*G03B 27/58*     (2006.01)

(52) U.S. Cl.
USPC .......................................................... 355/72

(58) Field of Classification Search
USPC .......................................... 355/72; 318/687
See application file for complete search history.

(56) References Cited

U.S. PATENT DOCUMENTS

| | | | |
|---|---|---|---|
| 4,506,204 A | 3/1985 | Galburt | |
| 4,506,205 A | 3/1985 | Trost et al. | |
| 4,952,858 A | 8/1990 | Galburt | |
| 5,969,441 A | 10/1999 | Loopstra et al. | |
| 6,040,675 A | 3/2000 | Ono | |
| 6,069,417 A * | 5/2000 | Yuan et al. | 310/12.07 |
| 6,259,174 B1 | 7/2001 | Ono | |
| 6,989,887 B2 * | 1/2006 | Poon et al. | 355/72 |
| 7,095,485 B2 | 8/2006 | Hol et al. | |
| 7,352,149 B2 | 4/2008 | Butler et al. | |
| 7,468,782 B2 | 12/2008 | Butler | |
| 2004/0223283 A1 * | 11/2004 | Hsin | 361/160 |
| 2005/0162802 A1 * | 7/2005 | Kho et al. | 361/139 |
| 2006/0061218 A1 | 3/2006 | Hazelton | |
| 2008/0054838 A1 * | 3/2008 | Butler et al. | 318/701 |

OTHER PUBLICATIONS

Molenaar et al, "A Novel Low Dissipation Long Stroke Planar Magnetic Suspension and Propulsion Stage," 6ISMB Conference, Boston, Aug. 1998, 10 pages.

* cited by examiner

*Primary Examiner* — Peter B Kim
*Assistant Examiner* — Deoram Persaud
(74) *Attorney, Agent, or Firm* — Sterne, Kessler, Goldstein & Fox P.L.L.C.

(57) ABSTRACT

A control system controls a positioning device displaceable in at least one degree of freedom by a reluctance motor. A force sensing element and a controller adjust force applied by the motor responsive to a force sensing element configured to sense force applied by the motor. The controller receives a signal representing force applied by the motor from the force sensing element, obtain an acceleration trajectory plan associated with a velocity trajectory plan for the positioning device, obtain a force trajectory plan associated with the acceleration trajectory plan, compare the force applied with a required amount of force obtained from the force trajectory, and adjust the amount of force applied by the motor based on the comparison. Related methods are also presented.

17 Claims, 20 Drawing Sheets

METHOD FOR CONTROLLING THE POSITION OF A MOVABLE OBJECT, A CONTROL SYSTEM FOR CONTROLLING A POSITIONING DEVICE, AND A LITHOGRAPHIC APPARATUS

CROSS-REFERENCE TO RELATED APPLICATIONS

This application claims the benefit of U.S. Provisional Application No. 61,221,853, filed on Jun. 30, 2009 by ROUX, Stephen et al, the entire contents of which is incorporated herein by reference and for which priority is claimed under 35 U.S.C. §1.119(e).

BACKGROUND

1. Field of Invention

This invention relates to a method for controlling the position of a movable object and a positioning system for a lithographic apparatus. More particularly, the invention relates to a method and a positioning system for controlling a short stroke module of a substrate stage or reticle stage of a lithographic apparatus.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, such as, for example, a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known lithographic apparatus includes a number of movable objects, which have to be actuated with relatively large accelerations and high accuracy. An example of such a movable object is a reticle stage, which supports a reticle during various lithographic processes. Another example is a wafer stage, which supports a wafer during the projection process. Such a wafer stage may include a long stroke module and a short stroke module. The long stroke module supports the short stroke module, while the short stroke module is configured to carry the wafer. The long stroke module is used for coarse positioning of the wafer stage, while the short stroke module is used for fine positioning of the wafer with respect to the projection system. In the known lithographic apparatus, a Lorentz motor is used for the actuation of the short stroke module. Such a Lorentz motor is known to be a very accurate motor with which the short stroke module can be placed with high accuracy in the correct position. However, Lorentz motors are not highly efficient and a relatively large amount of heat is dissipated during the use of the motor. Such dissipation of heat is generally undesirable, in particular when large forces have to be produced by the motor during acceleration of the short stroke module. The generated heat may have a negative influence on the control accuracy of the Lorentz motor and on the performance of other systems in the lithographic apparatus.

It has been proposed to provide two types of motors for the actuator arrangement of the short stroke module, one type having a high efficiency but being relatively inaccurate, the other type being highly accurate, but having a low efficiency. For example, U.S. Pat. Appl. Publication No. 2006/0061218 A1 proposes an actuator arrangement including two types of motor for the position control of a short stroke module. In this actuator arrangement, the use of E-I actuators (a type of reluctance motor that has high efficiency but is relatively inaccurate) is proposed to generate acceleration and deceleration forces to bring the short stroke module in the vicinity of a desired position. When the short stroke module is brought in the vicinity of the desired position, the control is taken over by a voice coil motor (a type of Lorentz motor that is highly accurate but has low efficiency), which is used to generate acceleration and deceleration forces to precisely control the position of the short stroke module. Thus, for the short stroke module there is carried out a coarse positioning phase in which the short stroke module is actuated by a first type of motor and a fine control phase in which the short stroke module is actuated by a second type of motor. Between these phases the two types of motors are switched off and on. As another example, U.S. Pat. No. 7,352,149 B2 proposes another actuator arrangement including two types of motor for the position control of a short stroke module in which the control involves using a feed-forward signal for a first motor assembly and a feedback signal for a second motor assembly. In this example arrangement, the first motor assembly can include any type of reluctance motors.

The use of reluctance motors in a positioning device is advantageous because they add less mass and dissipate less heat than other types of motors. However, the use of reluctance motors can behave nonlinearly and can also cause a parasitic damping effect.

BRIEF SUMMARY OF THE INVENTION

It is desirable to provide an actuator arrangement and control for a movable object, in particular a short stroke module of a wafer stage or reticle stage, in which various types of motors can be used for actuation of the same movable object and in which undesirable effects of using such motors are avoided.

An embodiment of the invention provides a control system for controlling a positioning device displaceable in a degree of freedom via at least one reluctance motor. The control system includes at least one force sensing element and a controller configured to adjust an amount of force applied by a corresponding reluctance motor based on output from a corresponding force sensing element configured to sense an amount of force applied by a corresponding reluctance motor. The controller is configured to receive a signal representing the amount of force applied by the corresponding reluctance motor from the corresponding force sensing element, obtain an acceleration trajectory plan associated with a velocity trajectory plan for the positioning device, obtain a force trajectory plan associated with the acceleration trajectory plan, compare the amount of force applied by the corresponding reluctance motor with a required amount of force obtained from the force trajectory plan, and adjust the amount of force applied by the corresponding reluctance motor based on the comparison to obtain a desired force. In an embodiment, the controller is configured to adjust a size of a gap between a core and a flux carrying bar of the corresponding reluctance motor in accordance with respective movement events of the positioning device. For example, the controller is configured to decrease the size of the gap to an optimum value prior to high force acceleration of the positioning device. According to an embodiment of the invention, the controller is configured to increase the size of the gap to an optimum value for movement of the positioning device at constant velocity after completion of the high force acceleration.

A lithography apparatus embodiment of the invention includes an illumination system configured to condition a radiation beam, a patterning device stage constructed to support a patterning device, the patterning device being capable of imparting the radiation beam with a pattern in its cross-section to form a patterned radiation beam, a substrate stage constructed to hold a substrate, and a projection system configured to project the patterned radiation beam onto a target portion of the substrate. The lithography apparatus further includes a positioning system configured to control a position of a short stroke module configured to hold one of the substrate or the patterning device in at least a first degree of freedom. The positioning system includes a first motor assembly including one or more reluctance motors configured to move the short stroke module in the first degree of freedom, a second motor assembly including one or more motors of a second type configured to move the short stroke module in the first degree of freedom, and a control system as described above for controlling at least the first motor assembly.

According to an embodiment of the invention, there is provided a method of positioning a movable object in a first degree of freedom. A motor assembly including one or more reluctance motors is configured to accelerate the movable object in the first degree of freedom. At least one feedback signal is provided that represents an amount of force applied by the motor assembly. At least one control signal adjusts the amount of force applied by the motor assembly based on the at least one feedback signal. The method may further include providing a controller configured to determine the at least one control signal based on the at least one feedback signal.

According to an embodiment, a method of positioning a short stroke stage of a lithographic apparatus in a first degree of freedom includes providing a motor assembly including one or more reluctance motors configured to accelerate the short stroke stage in the first degree of freedom. Each reluctance motor includes a core coupled to a long stroke stage associated with the short stroke stage, a flux carrier bar coupled to the short stroke stage, and a gap between the core and the flux carrier bar. The method further includes adjusting a size of the gap in accordance with respective movement events of the short stroke stage to minimize parasitic effects of a corresponding reluctance motor. In an embodiment, the adjusting the size of the gap includes adjusting the gap to a first size for high force acceleration of the short stroke stage in a first direction, adjusting the gap to a second size for constant velocity of the short stroke stage, and adjusting the gap to a third size for high force acceleration of the short stroke stage in a second direction.

According to an embodiment, a method of positioning a short stroke stage of a lithographic apparatus in a first degree of freedom includes accelerating the short stroke stage in a first direction with one or more reluctance motors at a first end of the short stroke stage and one or more additional motors of another type, driving the short stroke stage at an approximately constant velocity in the first direction with the one or more additional motors, accelerating the short stroke stage in a second direction opposite the first direction with one or more reluctance motors at a second end of the short stroke stage and the one or more additional motors, driving the short stroke stage at an approximately constant velocity in the second direction with the one or more additional motors, and adjusting respective amounts of force applied by the one or more reluctance motors at the first and second ends of the short stroke stage as needed based on output from one or more feedback sensors, each feedback sensor configured to sense an amount of force applied by a corresponding one of the one or more reluctance motors. In an embodiment, the adjusting respective amounts of force includes adjusting a current supplied to a respective reluctance motor. In an embodiment, the method further includes adjusting a size of a gap between a core and a flux carrying bar of a corresponding reluctance motor in accordance with respective movement events of the short stroke stage.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

Figure 1:
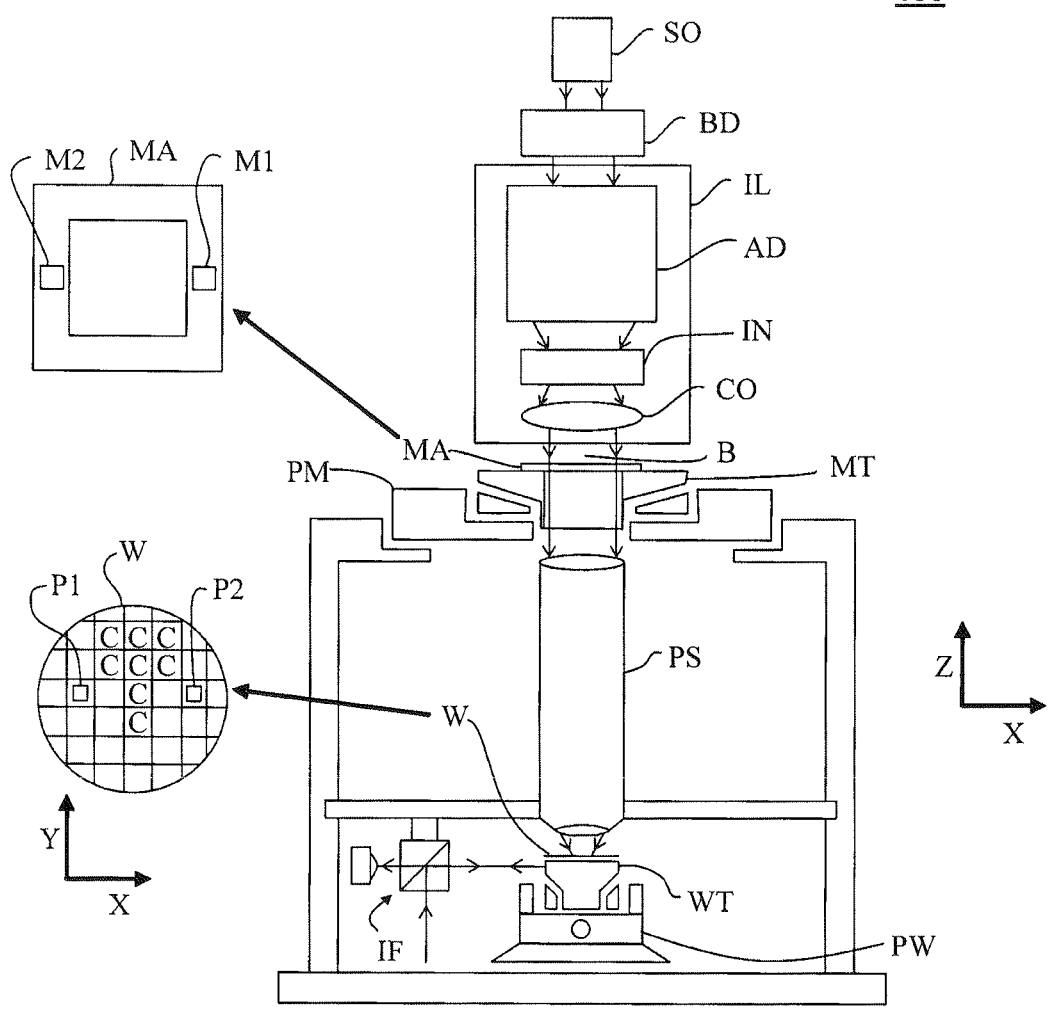
FIG. 1 depicts a lithographic apparatus according to an embodiment of the present invention.

Various features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Embodiments of the present invention are directed to positioning system control. This specification discloses one or more embodiments that incorporate the features of the present invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention can be implemented in hardware, firmware, software, or any combination thereof. Embodiments of the present invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include the following: read-only memory (ROM); random access memory (RAM); magnetic disk storage media; optical storage media; and, flash memory devices. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 is an illustration of a lithographic apparatus 100. Lithographic apparatus 100 includes the following: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and, a substrate table (e.g., a wafer table) WT configured to hold a substrate (e.g., a resist coated wafer) W and connected to a second positioner PW configured to accurately position the substrate W. Lithographic apparatus 100 also has a projection system PS configured to project a pattern imparted to the radiation beam B by patterning device MA onto a target portion (e.g., comprising one or more dies) C of the substrate W. In lithographic apparatus 100, the patterning device MA and the projection system PS are reflective. Alternatively, the patterning device MA and the projection system PS can be transmissive.

The illumination system IL can include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatus 100, and other conditions, such as for example whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA can be transmissive (as in lithographic apparatus 100) or reflective. Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons.

A vacuum environment can therefore be provided to the whole beam path with the aid of a vacuum wall and vacuum pumps.

Lithographic apparatus 100 can be of a type having two (dual stage) or more substrate tables (and/or two or more mask tables) WT. In such "multiple stage" machines, the additional substrate tables WT can be used in parallel, or preparatory steps can be carried out on one or more tables while one or more other substrate tables WT are being used for exposure.

Referring to FIG. 1, the illuminator IL receives a radiation beam from a radiation source SO. The source SO and the lithographic apparatus 100 can be separate entities, for example, when the source SO is an excimer laser. In such cases, the source SO is not considered to form part of the lithographic apparatus 100, and the radiation beam B passes from the source SO to the illuminator IL with the aid of a beam delivery system BD including, for example, suitable directing mirrors and/or a beam expander. In other cases, the source SO can be an integral part of the lithographic apparatuses 100—for example when the source SO is a mercury lamp. The source SO and the illuminator IL, together with the beam delivery system BD, if required, can be referred to as a radiation system.

The illuminator IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components, such as an integrator IN and a condenser CO, The illuminator IL can be used to condition the radiation beam B to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, or capacitive sensor), the substrate table WT can be moved accurately (e.g., so as to position different target portions C in the path of the radiation beam B). Similarly, the first positioner PM and another position sensor (not shown in FIG. 1) can be used to accurately position the mask MA with respect to the path of the radiation beam B (e.g., after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner) the mask table MT can be connected to a short-stroke actuator only or can be fixed. Mask MA and substrate W can be aligned using mask alignment marks M1, M2 and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Lithographic apparatus 100 can be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT can be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (e.g., having a wavelength λ of 365, 248, 193, 157 or 126 nm), extreme ultraviolet (EUV or soft X-ray) radiation (e.g., having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Figure 2:
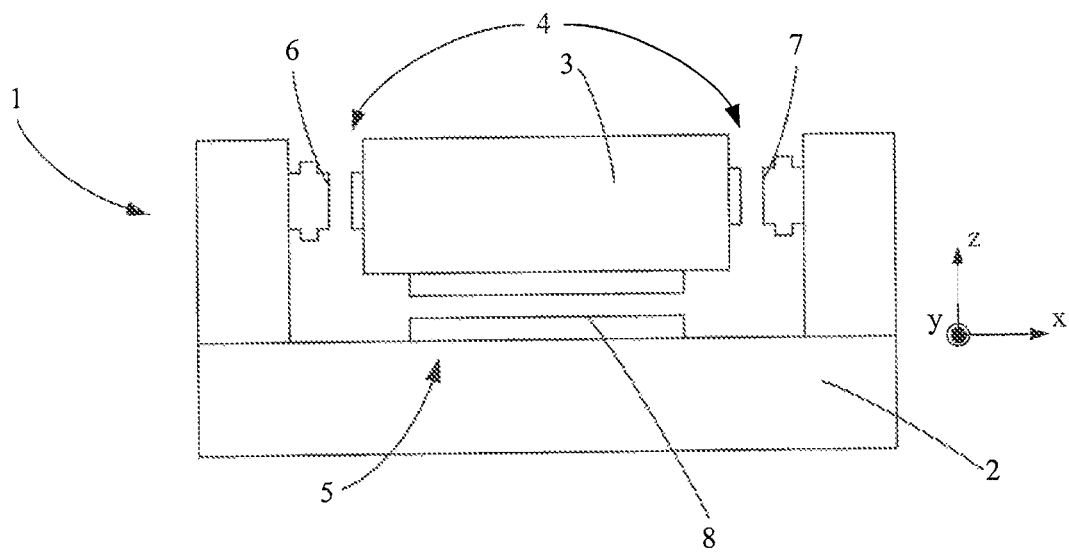
FIG. 2 depicts schematically a wafer stage including a positioning system according to an embodiment of the present invention.

FIG. 2 schematically depicts a wafer stage and a positioning system according to an embodiment of the invention. The wafer stage is in general indicated with reference numeral 1, and includes a long stroke module 2 and a short stroke module 3. The long stroke module 2 is used for coarse positioning of a wafer which may be carried by the short stroke module 3. The short stroke module 3 is used for fine positioning of a wafer carried by it.

To actuate the short stroke module 3 in the x-direction, a combination of a first motor assembly 4 and a second motor assembly 5 is provided. The first motor assembly 4 includes two reluctance motors 6 and 7, which are arranged at opposite sides of the short stroke module 3. Such reluctance motor includes a coil which is preferably connected to the long stroke module 2 and a body of ferrous material, for instance an iron bar, preferably arranged on the short stroke module 3.

It is desirable to provide a reluctance motor 6, 7 at each side of the short stroke module as these reluctance motors 6, 7 can only be used to attract the short stroke module 3. Thus, with the reluctance motor 6, the short stroke module 3 can be moved to the left of the drawing, but in order to move the short stroke module 3 in the opposite direction, i.e. in the drawing to the right, the reluctance motor 7 at the opposed side of the short stroke module 3 has to be used.

The second motor assembly 5 includes a Lorentz motor 8 which is arranged on the short stroke module 3. Such Lorentz motor includes a coil which is preferably arranged on the long stroke module 2 and a magnet which is arranged on the short stroke module 3.

Reluctance motors 6 and 7 are known to be highly efficient motors, which relatively do not generate much heat. These reluctance motors 6 and 7 are very useful for acceleration and deceleration of the short stroke module 3, as a low amount of heat is generated during the acceleration/deceleration of the short stroke module 3. However, the reluctance motors 6 and 7 have a relatively low accuracy, and are therefore not suitable for the fine positioning of the short stroke module 3.

The Lorentz motor 8 (e.g., a voice coil motor) is relatively accurate in fine positioning the short stroke module 3. However, the Lorentz motor 8 has a relatively low efficiency, and therefore a considerable amount of heat is generated when the motor is used for accelerating/decelerating the short stroke module 3. Any other type of motor which makes a highly accurate positioning of the short stroke module 3 possible may also be used as a motor of the second motor assembly 5.

By using a combination of first a motor assembly including one or more motors of a first type having a high efficiency, but relatively low accuracy, and a second motor assembly including one or more motors of a second type having a low efficiency and high accuracy, to actuate the short stroke module 3 in a degree of freedom, the benefits of each type of the motors of the first and second motor assemblies can be used in the actuation of the short stroke module 3.

An embodiment of a lithographic apparatus employs a combination of a first motor assembly and a second motor assembly having motors of a different type. See U.S. Pat. Appl. Publication No. 2006/0061218 A1, the contents of which are herein incorporated by reference in their entirety as if fully set forth herein. In this embodiment the first motor assembly is, in a first step to control the position of a short stroke module, used to accelerate the short stroke module 3 in the direction of the desired position or in the vicinity of a desired speed. When the short stroke module 3 comes in the vicinity of the desired position or speed, the actuation of the short stroke module is taken over by the second motor assembly with which the short stroke module may be brought accurately in the desired position or held at the desired speed. During the fine positioning of the short stroke module 3, the first motor assembly is switched off to avoid any interference of the motor or motors of the first motor assembly in the fine positioning of the short stroke module 3.

Figure 3A:
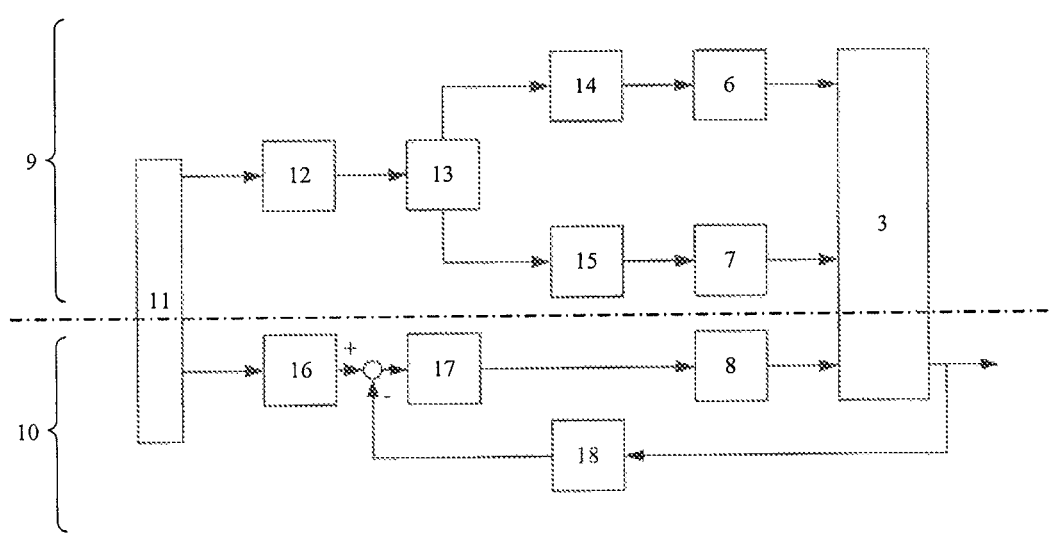
FIG. 3A depicts schematically a position control scheme of the positioning system of FIG. 2.

However, it may be undesirable to switch motors on and off during the control of the short stroke module 3. FIG. 3A shows a control scheme of a positioning system described in U.S. Pat. No. 7,352,149 B2, in which the switching on and off of motors of the positioning system is not required even though the benefits of utilizing both types of motors of the first assembly 4 and second motor assembly 5 can be obtained.

The control scheme of FIG. 3A has a feed-forward part generally indicated with reference numeral 9, and a feedback control part 10. In the feed-forward part 9 of the control scheme, only the first motor assembly 4 including the reluctance motors 6, 7 is actuated. The feed-forward part 9 of the control scheme includes a feed-forward unit 12, which may feed-forward a feed-forward signal to the first motor assembly 4 on the basis of a feed-forward reference signal. The feed-forward reference signal is generated by the reference signal generator 11 and may for instance be a position, speed or acceleration set-point signal, or a combination thereof. The feed-forward unit may be used to perform any feed-forward operation on the feed-forward reference signal, such as multiplying with a feed-forward gain.

The output signal of the feed-forward unit is fed into a splitting unit 13 which is configured to split the output signal of the feed-forward unit in a positive part and a negative part. The positive part is used for a first 6 of the two reluctance motors, while the negative part is used for the other 7 of the reluctance motors. The splitting of the feed-forward signal is desired as the reluctance motors 6, 7 can only be used to actuate the short stroke module 3 in one direction, as was explained above.

Before the positive part and negative part are used to actuate the respective reluctance motor 6, 7, the signals are first fed into a respective linearization unit 14, 15. Linearization of the positive part and negative part of the splitting unit 13 may be desirable as the behavior of the reluctance motors 6 and 7 may not be linear. The term "linearization," as used in this context, is feedback linearization. The linearity compensation may for example be based on the distance between the long stroke module 2 and the short stroke module 3. In addition, the force generated by the reluctance motors 6, 7 may be quadratically dependent on the current fed through them, which may also make the provision of linearization units 14 and 15 desirable. When the (non)linear behavior of the reluctance motors 6, 7 is not regarded to be of importance, for instance when the short stroke module 3 is only moved in a very small range, the linearization units 14 and 15 may be omitted.

After linearization of the positive and negative part, the output signal of the linearization units 14, 15 may be fed to the reluctance motors 6, 7. In practice, the signal sent to the reluctance motors 6, 7 may have the form of a current, which is generated by an amplifier in response to the signals generated by the linearization units 14, 15. These amplifiers are however not shown in FIG. 3A.

In the feedback control part 10 of the control scheme only the second motor assembly 5 including the Lorentz motor 8 is actuated. The feedback control part 10 is fed with a reference signal generated in the reference signal generator 11. This reference signal which preferably is a position set-point signal and preferably does not include an acceleration component is fed to a time lag unit 16. In this time lag unit 16, the signal may be held for a certain time, or in a digital control system for a number of samples, to make the reference signal of the feedback control part 10 lag with respect to the reference signal of the feed-forward part 9. The time lag unit 16 makes it possible to synchronize the signal as fed to the control unit 17 with the movement as achieved by the feed-forward part 9. Any delay in the reaction of the system to the feed-forward part 9 then does not lead to a position error in the feedback loop. If the above-mentioned delay is small enough by itself, the time lag unit 16 may be omitted.

The reference signal leaving the time lag unit 16 will be compared with the actual position of the short stroke module 3 which is measured by a position measurement sensor 18. Such sensor 18 may be any position sensor capable of measuring the position of the short stroke module 3 in the respective degree of freedom and is well-known in the art. The difference between the reference signal and the actual position will be fed to a control unit 17. The control unit 17 will provide a control signal to the Lorentz motor 8 on the basis of the difference between the desired position and the actual measured position of the short stroke module 3. Also, the signal sent to the Lorentz motor 8 may have the form of a current, which is generated by an amplifier (not shown in FIG. 3A) in response to the control signal generated by the control unit 17. With the feedback control loop including a relatively accurate Lorentz motor 8, accurate fine positioning of the short stroke module 3 can be obtained. The control unit 17 may be any type of suitable controller known in the art, such as a PI or PID controller.

As the first motor assembly 4 is only actuated in the feed-forward part 9 and the second motor assembly 5 is only actuated in the feedback control part 10, the actuation of the first and second motor assemblies 4, 5 do not interfere with each other. As a result, both the first and second motor assemblies 4 and 5 may continuously be actuated without the first motor assembly disturbing the fine positioning performed in the feedback control part 10 by the second motor assembly 5 and it is not necessary to switch between the motor assemblies to benefit from the typical characteristics of both types of motors.

In the above description, and further description below, the positioning system is described for a single degree of freedom. In practice, a corresponding combination of a first and a second motor assembly including different types of motors may also be applied for one or more further degrees of freedom. For instance a positioning system for the position control of short stroke module 3 of the wafer stage may be applied in both the x-direction and the y-direction.

The positioning system in embodiments of the present invention is in particular suitable for the position control of a movable object which has to be accelerated/decelerated within a very short time and consequently has to be controlled with high accuracy. With the positioning system described above, this can be achieved in a short time without having settling phenomena caused by interference between different motor types and without the need to switch one or more of the motor types off during a certain phase of the controlling of the position of the short stroke module 3.

The above-described positioning system is used to actuate the short stroke module to a certain desired position. In practice, the positioning system will also be used to move the short stroke module, or any other movable object, with a certain constant speed, or more generally along a certain position or speed trajectory. In a constant-speed embodiment the feed-forward part 9 of the control scheme may be used to accelerate the short stroke module to a speed close to the desired speed, while the feedback control 10 part keeps the short stroke module at the same speed. The feed-forward reference signal may be a reference acceleration. The position reference signal may be a changing position set-point or a speed set-point and the signal representative for the actual position of the short stroke module may be a position signal of a position sensor or a speed signal of a speed sensor. For further information on positioning systems such as the positioning system described above, see U.S. Pat. No. 7,352,149 B2, which is incorporated by reference herein in its entirety.

Hereinabove, an embodiment of a positioning system is described which is used for the actuation of a short stroke module of a wafer stage. Embodiments of positioning systems described herein could also be used for any other movable object such as, for instance, a reticle stage or a part thereof, or a wafer stage which is not divided into a short stroke module and a long stroke module.

FIG. 3A depicts a position control scheme of a positioning system. Without further control, however, linearization problems (i.e., nonlinearities) and parasitic damping effects may occur. The following describes further embodiments of positioning systems using alternative control techniques that, in particular, avoid problems such as nonlinearities and parasitic damping effects.

FIG. 3A depicts a position control loop, with portion 10 including position feedback, and with portion 9 including a feedforward path. The scheme shown in FIG. 3A does not include force feedback. By using force control loops in place of, or in addition to, feedback linearization blocks 14/15, force feedback can be used for a more accurate positioning system.

Figure 3B:
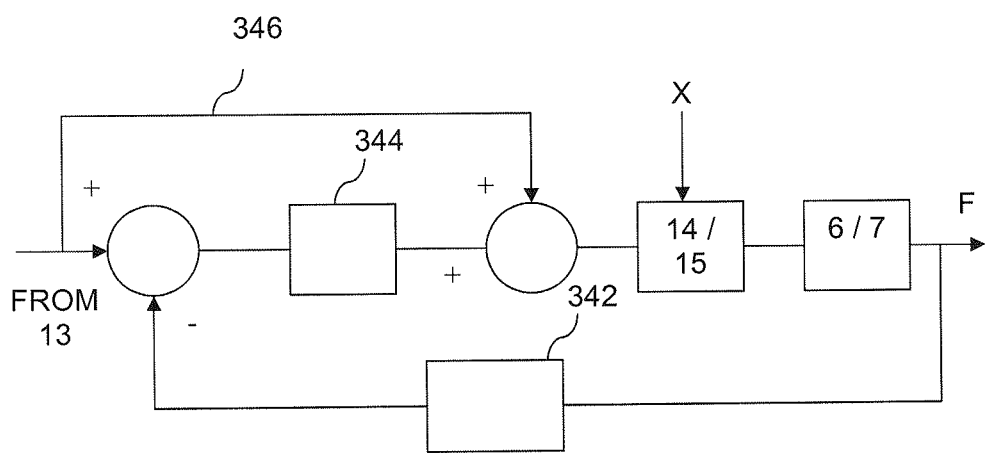
FIG. 3B depicts schematically a force control scheme of the positioning system, according to an embodiment of the present invention.

FIG. 3B depicts a force control scheme of a positioning system in relation to the position control scheme shown in FIG. 3A. As shown in FIG. 3B, a force sensing element (sensor) 342 can be used to provide force feedback. In addition, a linear controller 344 can be used to avoid linearization issues. Linearization units 14/15 and reluctance motors 6/7 are included and function as described above with reference to FIG. 3A. Feedforward command loop 346 can also be included. The force control depicted in FIG. 3B can be used to command changes in force necessary to provide more accurate positioning of a stage, as further described below.

Figure 4:
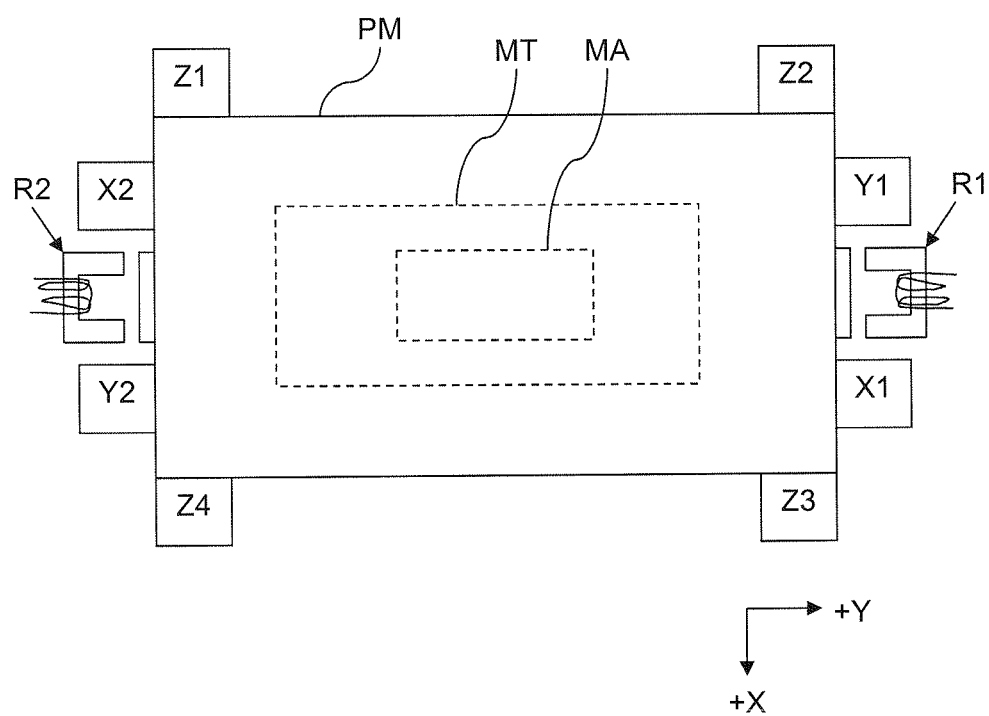
FIG. 4 depicts schematically a reticle stage including a positioning system according to an embodiment of the present invention.

FIG. 4 depicts a stage 400 including a positioning system according to an embodiment of the invention. Stage 400 includes first positioner PM for positioning, for example, a mask table MT that supports a reticle, or mask, MA. As a reticle stage, stage 400 is to be moved primarily in the +/−Y-direction for scanning during a lithographic operation, for example. However, it can also be moved in the other five degrees of freedom. For example, stage 400 can include motors (e.g., motors X1 and X2) for movement in the X-direction and also a yaw rotation. Stage 400 can also include motors (e.g., motors Z1-Z4) for movement in the Z-direction (perpendicular to the plane of FIG. 4) and also roll and pitch rotations. This description, however, focuses on movement in the Y-direction via motors such as motors Y1, Y2 and R1, R2.

For movement in the Y-direction, stage 400 can include, for example, one or more motors Y1 at one end of stage 400 and one or more motors Y2 at an opposite end of stage 400. Motors Y1 and Y2 can be, for example, Lorentz-type motors, voice coil motors or other linear motors that can position with high accuracy, as discussed above. Stage 400 can also include one or more reluctance motors R1 at one end of stage 400 and one or more reluctance motors R2 at an opposite end of stage 400. The force applied by any of the motors for movement of stage 400 is controlled via currents applied to the motors. Motors Y1, Y2 can move in one direction by applying a desired current, and can move in the opposite direction by applying a desired current in the reverse direction. As discussed above, reluctance motors can only move in one direction (i.e., they can only "pull"). Referring to FIG. 4, for movement of stage 400 in the +Y-direction, a desired current is applied to reluctance motor R1, and no current is applied to reluctance motor R2. For movement in the −Y-direction, a desired current is applied to reluctance motor R2, and no current is applied to reluctance motor R1. As reluctance motors R1, R2 have lower accuracy, but are highly efficient motors that relatively do not generate much heat, it may be preferable that reluctance motors R1, R2 be used for acceleration and deceleration of stage 400 and not for an exposure operation that requires more accuracy.

Figure 5:
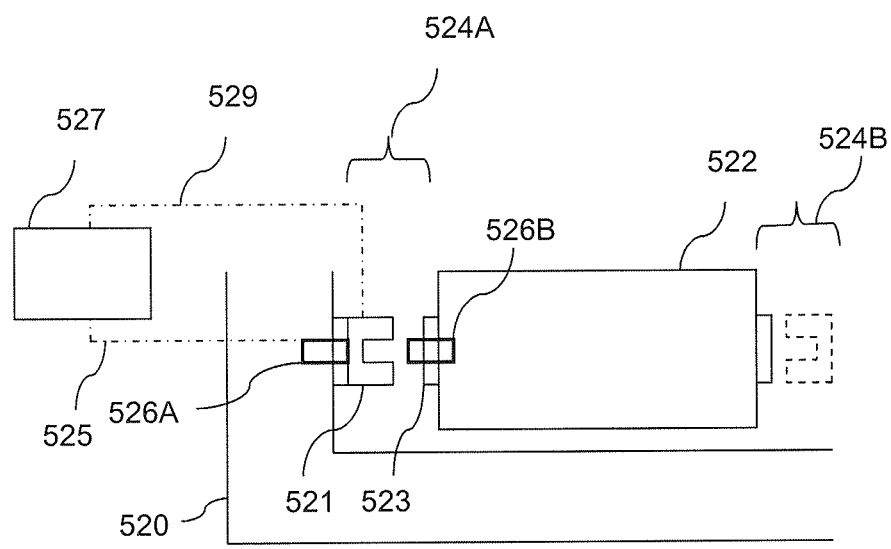
FIG. 5 depicts schematically a stage including a positioning system having a force sensing element according to an embodiment of the present invention.

Embodiments involving control of a stage such as stage 400 will now be described. FIG. 5 depicts a long stroke stage 520 associated with a short stroke stage 522 in accordance with an embodiment of the present invention. Short stroke stage 522 is shown having reluctance motor 524A at one end and reluctance motor 524B at the opposite end. For ease of description, other motors, such as those described above with reference to FIG. 4, are not shown.

In the embodiment shown in FIG. 5, core 521 of reluctance motor 524A is coupled to long stroke stage 520. Core 521 is shown as a "C"-shaped core. However, other shaped cores (e.g., "E"-shaped, annular, etc.) can be used. Flux carrier bar 523 of reluctance motor 524A is coupled to short stroke stage 522. As discussed above, reluctance motors have a much higher efficiency in creating force. Because force is proportional to current squared, there is much lower heat dissipation. One downfall of this, however, is that a linearization problem is then introduced. This linearization problem can be resolved by providing control of a reluctance motor based on the output of a force sensing element (sensor) rather than a gap or a flux sensor.

In an embodiment, one way to provide control for reluctance motor 524A is, for example, to place a force sensing element 526 (e.g., a piezo ceramic, a strain gauge, etc.) in the vicinity of reluctance motor 524A to measure the force applied by reluctance motor 524A. For example, force sensing element 526A can be placed on or near core 521 of reluctance motor 524A. Alternatively, or in addition, force sensing element 526B can be placed on or near flux carrier bar 523 of reluctance motor 524A. During acceleration of short stroke stage 522, the force applied by reluctance motor 524A can be measured by force sensing element 526 and a signal 525 can be sent to a controlling device (controller) 527. Controlling device 527 can then determine a force adjustment to send as signal 529 to reluctance motor 524A to adjust the force applied. Signal 529 can be, for example, a signal to an amplifier or current-generating device (not shown) that can then adjust a current being provided to reluctance motor 524A. It will be appreciated by one of ordinary skill in the relevant arts that the controlling device can rely on a plurality of signals from a plurality of sensors to control different aspects of positioning, etc. Herein, the discussion is focused mainly on control of force.

In an embodiment, controller 527 can be, for example, a processor that is part of the positioning system or it can be external to the positioning system. Controller 527 determines the force adjustment to be provided to a reluctance motor to adjust the force applied by the reluctance motor. In an embodiment, controller 527 determines the force adjustment by obtaining an acceleration trajectory plan from a velocity trajectory plan of short stroke stage 522.

Figure 6A:
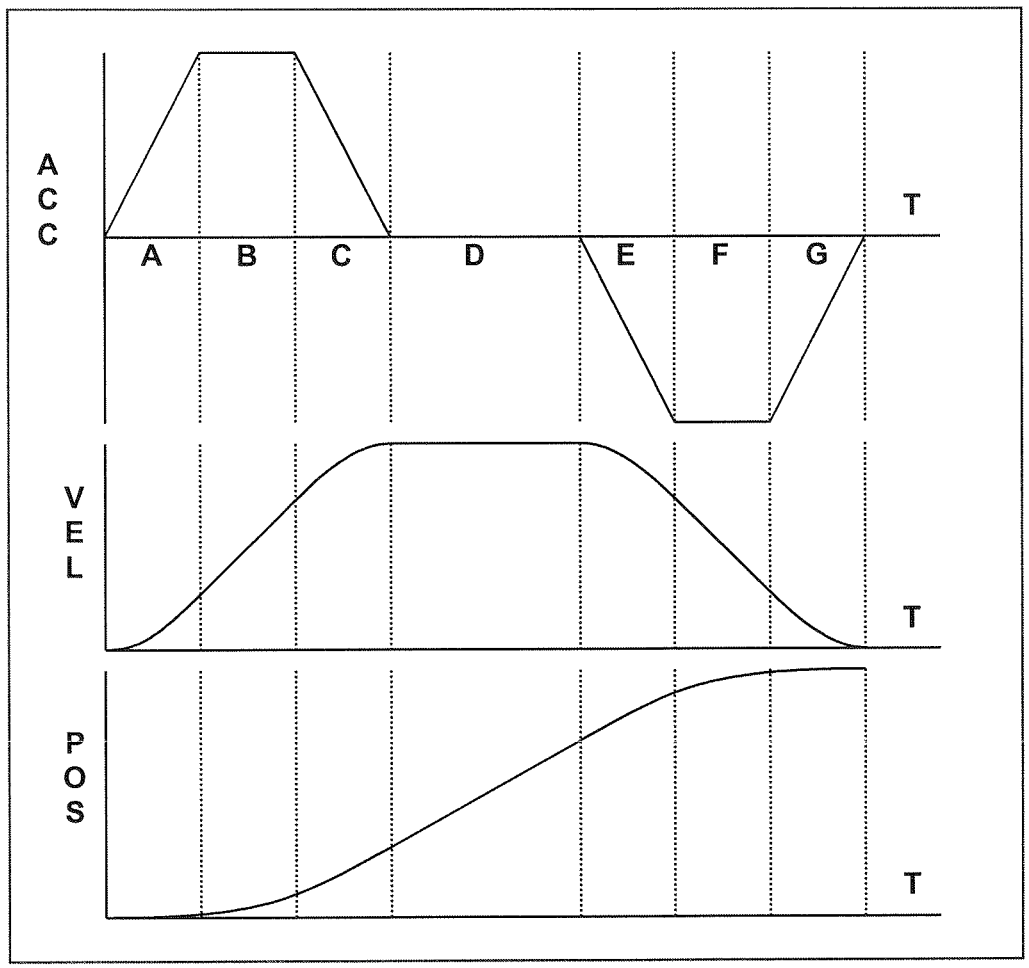
FIG. 6A includes graphical acceleration, velocity, and position trajectory plans for a stage according to an embodiment of the present invention.

FIG. 6A graphically depicts acceleration, velocity, and position trajectory plans for a stage according to an embodiment of the present invention. In time segment A, acceleration increases. In time segment B, acceleration is constant, and there is linear increasing speed (velocity). In time segment C, acceleration decreases. In time segment D, there is no acceleration (acceleration of zero), and the velocity is constant (during lithographic exposure, for example). In time segment E, deceleration increases and there is decreasing velocity. In time segment F, deceleration is constant, and there is linear decreasing velocity. In time segment G, there is decreasing deceleration, and decreasing velocity. The cycle can then repeat.

Figure 6B:
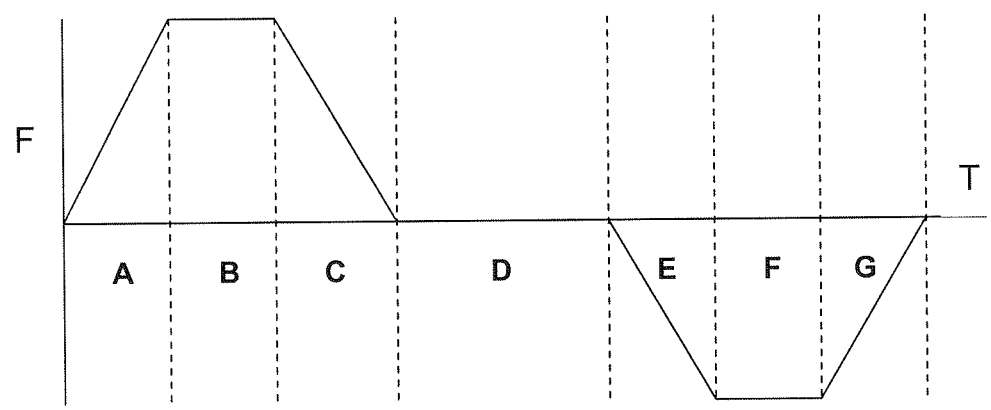
FIG. 6B is a graphical force trajectory plan for a stage according to an embodiment of the present invention.

Using Newton's second law, a force trajectory plan (force as a function of time) can be derived from the acceleration trajectory (or more generally, from a setpoint trajectory). The feedforward force trajectory may not necessarily be equal to mass (e.g., a stage mass) times the acceleration trajectory, as a stage is not necessarily a rigid mass. The feedforward force trajectory can include other components that are proportional to higher-order derivatives of the acceleration trajectory. In an embodiment, controller 527 can perform the derivation of the force trajectory. Alternatively, controller 527 can obtain the force trajectory from an external source (not shown). An example of a force trajectory plan is shown in FIG. 6B, according to an embodiment of the present invention. The force trajectory can provide the amount of the force needed at a given time. By comparing the amount of force measured by force sensing element 526 to the amount of force required per the force trajectory, controller 527 can determine an appropriate force adjustment (e.g., by taking the difference between the measured force and the required force).

The above-described method of closing a servo loop around a force trajectory using a force sensing element as feedback is one way of using a force sensing element to control a reluctance motor. Other methods of controlling a reluctance motor using a force sensing element may also become apparent to persons skilled in the relevant art without departing from the spirit and scope of the invention. For example, it will be appreciated that the above described method can also be accomplished using derivatives of position (e.g., the position trajectory).

Figure 7:
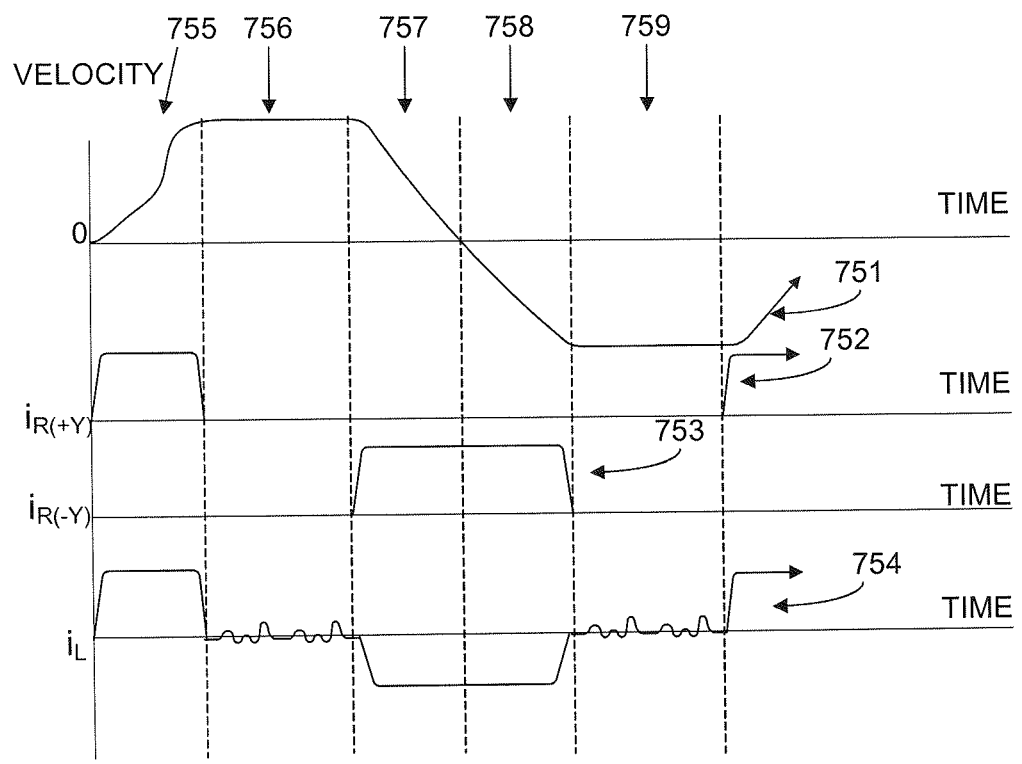
FIG. 7 is a timing diagram showing currents provided to various stage motors during stage movement events according to an embodiment of the invention.

The velocity trajectory plan shown in FIG. 6A can be used to show how motors such as motors Y1, Y2 and motors R1, R2 (FIG. 4) can work together to move a stage in, for example, the Y-direction. FIG. 7 is a timing diagram showing currents provided to various stage motors during stage movement events, according to an embodiment of the present invention. A velocity trajectory 751 is shown at the top of the diagram to delineate the various movement events of the stage. During acceleration of the stage, as shown by portion 755, a current $i_{R+Y}$ is provided to the reluctance motor that provides actuation in the +Y-direction (e.g., reluctance motor R1 of FIG. 4), no current is provided to any reluctance motors on the opposite end of the stage (e.g., reluctance motor R2 of FIG. 4), and a maximum current $i_L$ is provided to the non-reluctance motors used for movement in the Y-direction (e.g., motors Y1, Y2). When the stage reaches a desired maximum velocity, as shown by portion 756, no current is provided to the reluctance motors, and maintenance currents are provided to the non-reluctance motors (e.g., motors Y1, Y2) to maintain servo control of the stage (e.g., during lithographic exposure). Once exposure is complete, the stage is decelerated, as shown by portion 757, by providing a current in the reluctance motor that handles movement in the −Y direction (e.g., reluctance motor R2 of FIG. 4), no current to the reluctance motor that handles movement in the +Y direction (e.g., reluctance motor R1 shown in FIG. 4), and a maximum current to the non-reluctance motors (e.g., Y1, Y2 shown in FIG. 4) that is in the opposite direction as the current that was provided during acceleration. When the velocity reaches zero (between portions 757 and 758), the stage begins to accelerate in the opposite direction until it once again reaches a desired maximum velocity, shown in portion 759. During portion 759, no current is provided to the reluctance motors, and maintenance currents are provided to the non-reluctance motors (e.g., motors Y1, Y2) to maintain servo control of the stage (e.g., during lithographic exposure). Once exposure is complete, the cycle can repeat.

Figure 8:
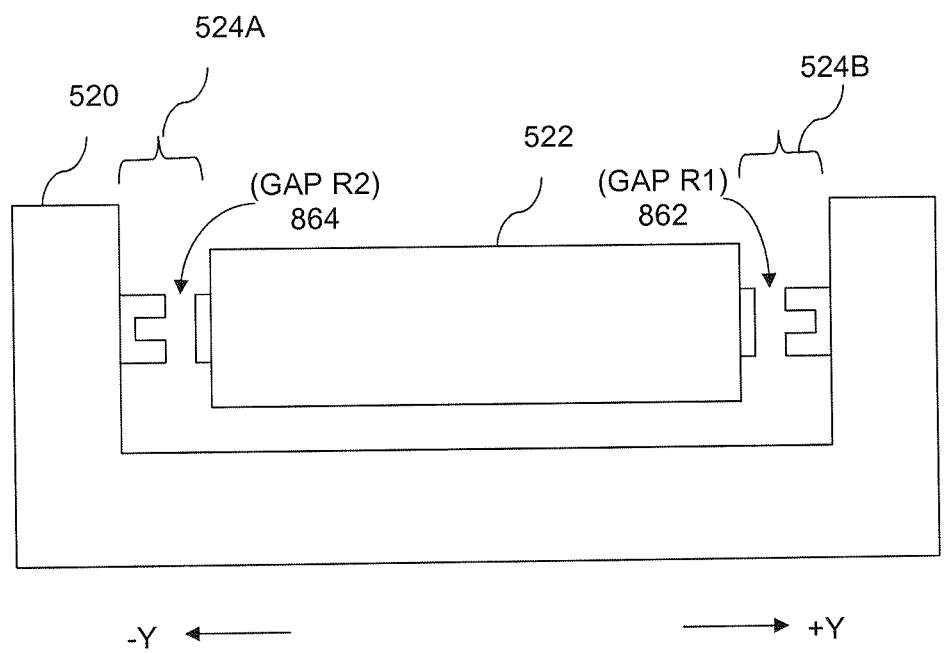
FIG. 8 depicts schematically a stage including a positioning system according to an embodiment of the present invention.

The force applied by a reluctance motor to a stage, and therefore the influence of the reluctance motor on the stage, is strongly sensitive to the gap between a reluctance motor's core and flux carrying bar. FIG. 8 depicts long stroke stage 520 and short stroke stage 522 as depicted in FIG. 5, in accordance with an embodiment of the present invention. As shown in FIG. 8, reluctance motor 524B has a gap 862 (GAP R1) between its core and flux carrying bar, and reluctance motor 524A has a gap 864 (GAP R2) between its core and flux carrying bar. In order to minimize parasitic effects common to a reluctance motor, one can adjust these gaps for optimum use depending on the movement event of the stage. For example, in an embodiment, a stage's reluctance motors can be initially set to have nominal large gaps 862, 864 (e.g., on the order of 120 µm). Just prior to acceleration of the stage (i.e., just prior to the reluctance motors going active) in either the +Y or −Y direction, gaps 862, 864 can be decreased in size (e.g., on the order of nanometers). Once the acceleration event is complete, the size of gaps 862, 864 can then be increased back to a nominal size. When a reluctance motor is not in use (e.g., during acceleration in an opposite direction to the direction handled by the reluctance motor), the gap can be set to a maximum size. In an embodiment, the gap size can be changed by setting a relative setpoint of the long stroke stage to the short stroke stage. However, other methods of changing the gap size will be apparent to persons skilled in the relevant art without departing from the spirit and scope of the invention. The changing of the gap size can be done independently of the embodiments described above with regard to providing a servo control loop via a force sensing element, or can be done in conjunction with those embodiments. In addition, the controlling of the gap size can be accomplished using the feedback portion of the positioning system, and portion 10 as shown in FIG. 3A. Alternatively, the controlling of the gap size can be accomplished using a different or separate controller.

Figure 9:
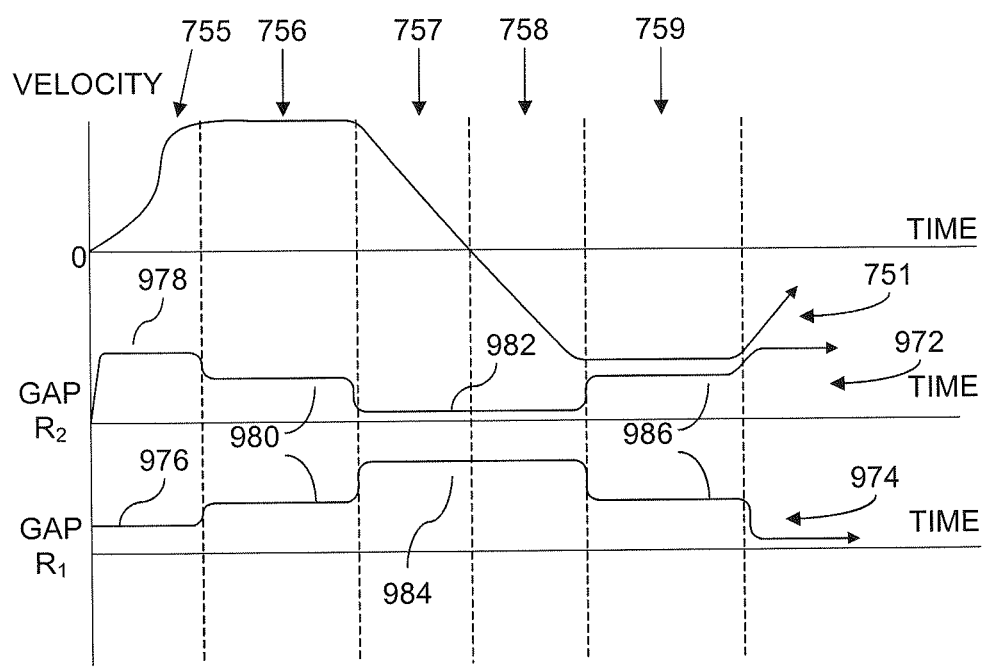
FIG. 9 is a timing diagram showing gap size changes in reluctance motors during stage movement events according to an embodiment of the invention.

FIG. 9 is a timing diagram showing gap size changes in reluctance motors during stage movement events according to an embodiment of the invention. The stage movement events are described with reference to a velocity trajectory 751, as was done in the timing diagram of FIG. 7. The changes in size of GAP R2 are shown by function 972, and the changes in size of GAP R1 are shown by function 974. During acceleration of the stage in the +Y direction, as shown by portion 755, GAP R1 (gap 862 in FIG. 8) is at a minimum (976) for application of high force by reluctance motor 524B, while GAP R2 (gap 864 in FIG. 8) is at a maximum (978), as reluctance motor 524A is not activated. When the stage reaches a desired maximum velocity, as shown by portion 756, GAP R1 and GAP R2 are set at a nominal size 980. During deceleration of the stage, as shown by portion 757, GAP R2 (gap 864 in FIG. 8) is at a minimum (982) for application of high force by reluctance motor 524A, while GAP R1 (gap 862 in FIG. 8) is at a maximum (984), as reluctance motor 524B is not activated. This is maintained through portion 758 until a desired maximum velocity in the opposite direction is reached. At the desired maximum velocity, as shown by portion 759, GAP R1 and GAP R2 are set at a nominal size 986. The timing diagram embodiment shown in FIG. 9 is one example of using gap size changes in reluctance motors to optimize stage positioning. Other methods of involving the changing of the gap size will be apparent to persons skilled in the relevant art without departing from the spirit and scope of the invention.

In an embodiment, the above-described positioning can be summarized as follows. A short stroke stage can follow a position/velocity/acceleration trajectory, with feedback and feedforward paths as described with reference to FIG. 3A, and also with force control via the force loop in the feedforward path as shown in FIG. 3B. In addition, via a corresponding long stroke stage, the gap between the long stroke stage and the short stroke stage can be dynamically changed. This gap (shown as input X in FIG. 3B) can be used by block 14 (in FIGS. 3A and 3B) for the feedback linearization.

Figure 10:
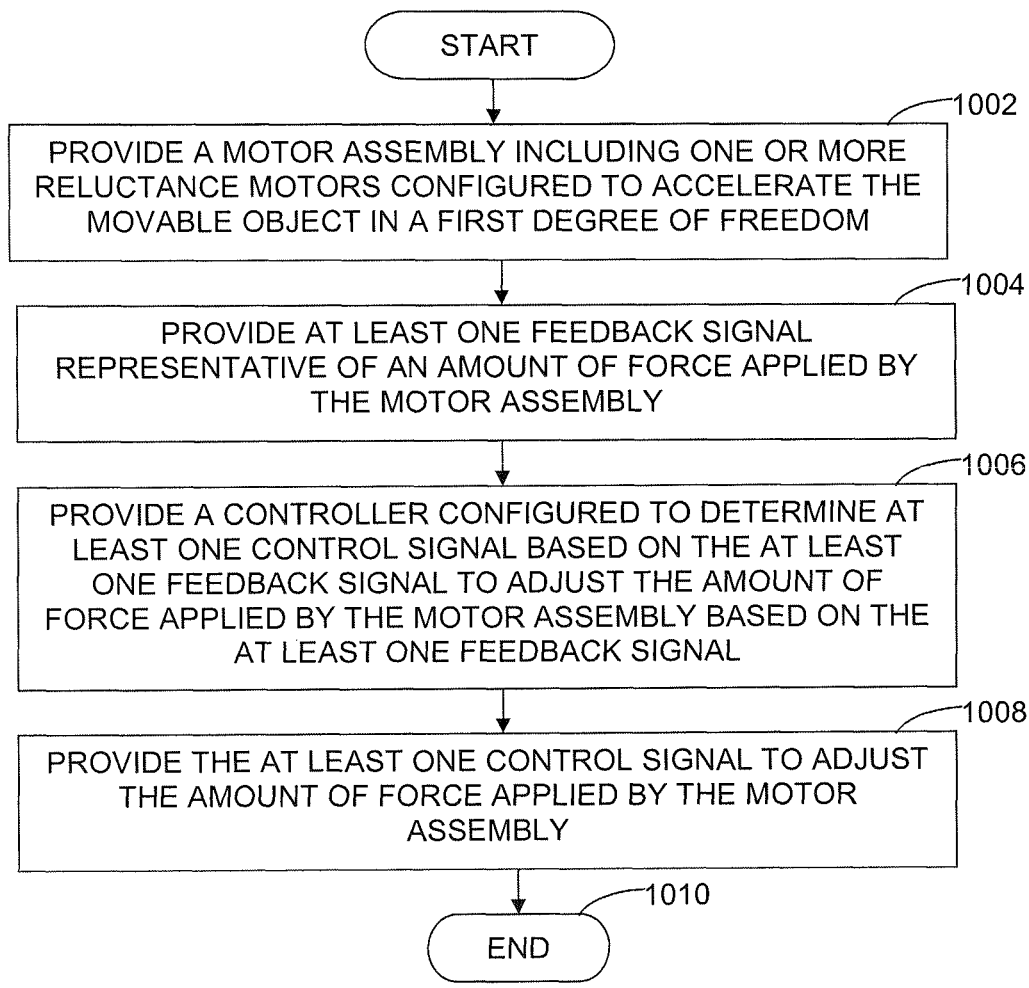
FIG. 10 is a flowchart depicting a method of positioning a movable object according to an embodiment of the invention.

FIG. 10 is a flowchart depicting a method 1000 of positioning a movable object according to an embodiment of the invention. In step 1002, a motor assembly is provided including one or more reluctance motors configured to accelerate the movable object in a first degree of freedom. In step 1004, at least one feedback signal representative of an amount of force applied by the motor assembly is provided. In step 1006, a controller is provided, the controller configured to determine at least one control signal based on the at least one feedback signal to adjust the amount of force applied by the motor assembly based on the at least one feedback signal. In step 1008, the at least one control signal is provided to the motor assembly to adjust the amount of force applied by the motor assembly. Method 1000 then ends.

Figure 11:
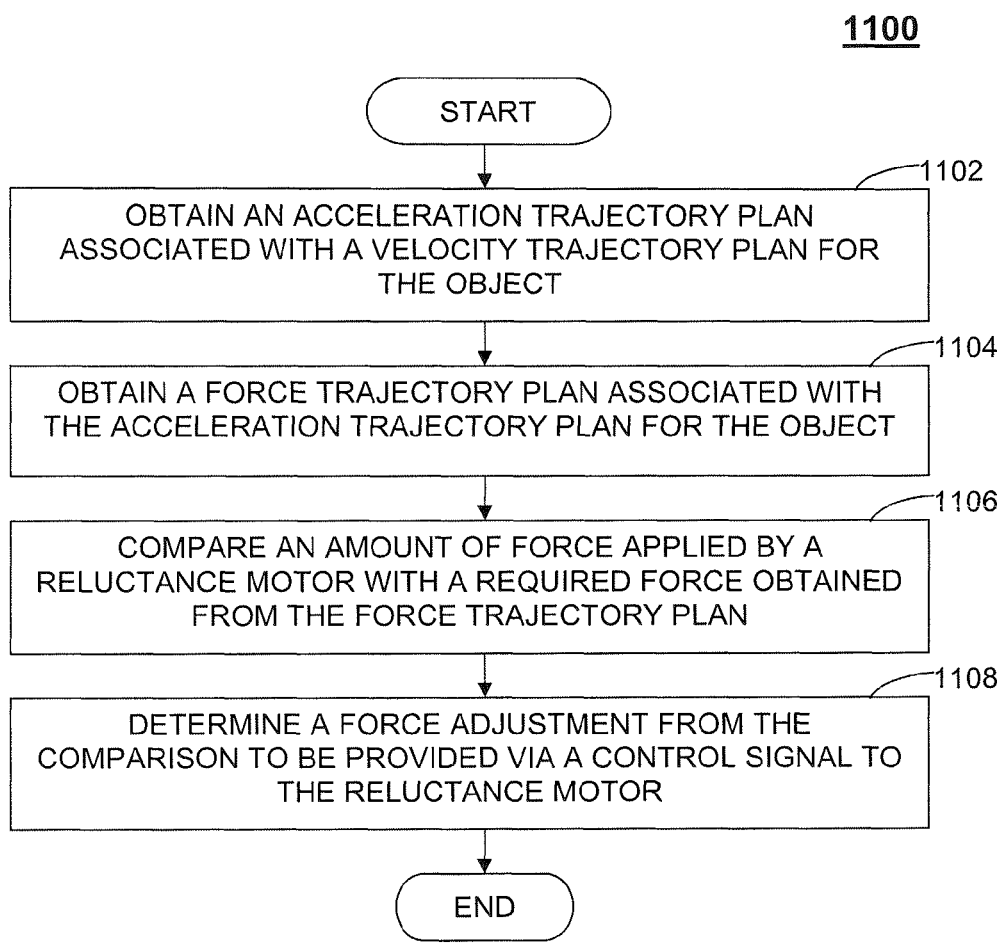
FIG. 11 is a flowchart depicting a method of determining a force adjustment that can be used in conjunction with the method shown in FIG. 10, according to an embodiment of the present invention.

FIG. 11 is a flowchart depicting a method 1100 of determining a force adjustment that can be used in conjunction with the method shown in FIG. 10, according to an embodiment of the present invention. In step 1102, an acceleration trajectory plan associated with a velocity trajectory plan for the object is obtained. In step 1104, a force trajectory plan associated with the acceleration trajectory plan for the object is obtained. In step 1106, an amount of force applied by a reluctance motor is compared with a required force obtained from the force trajectory plan. In step 1108, a force adjustment is determined from the comparison. The force adjustment can then be provided via a control signal to the reluctance motor. Method 1100 then ends.

Figure 12:
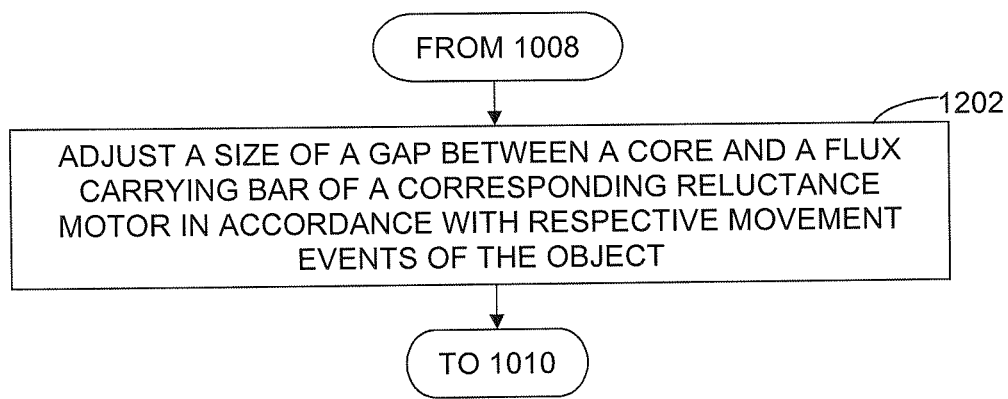
FIG. 12 is a flowchart depicting an optional further step of the method shown in FIG. 10 according to an embodiment of the present invention.
Figure 13:
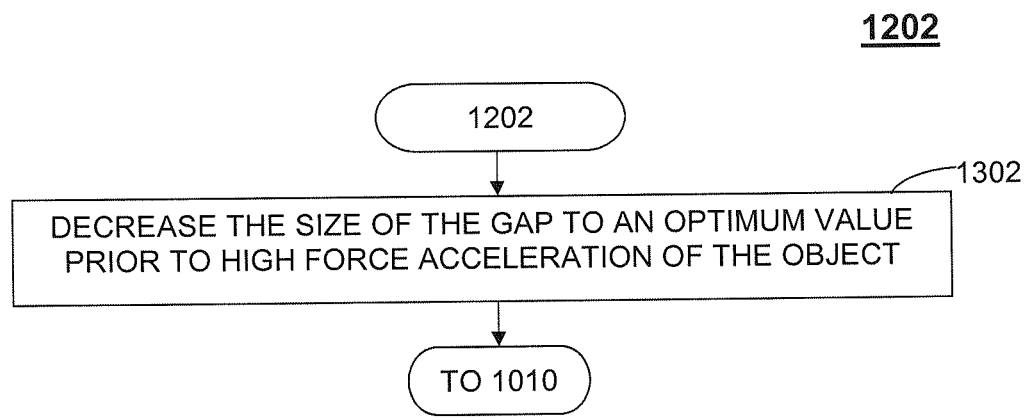
FIGS. 13 and 14 are flowcharts further describing step 1202 according to embodiments of the present invention.
Figure 14:
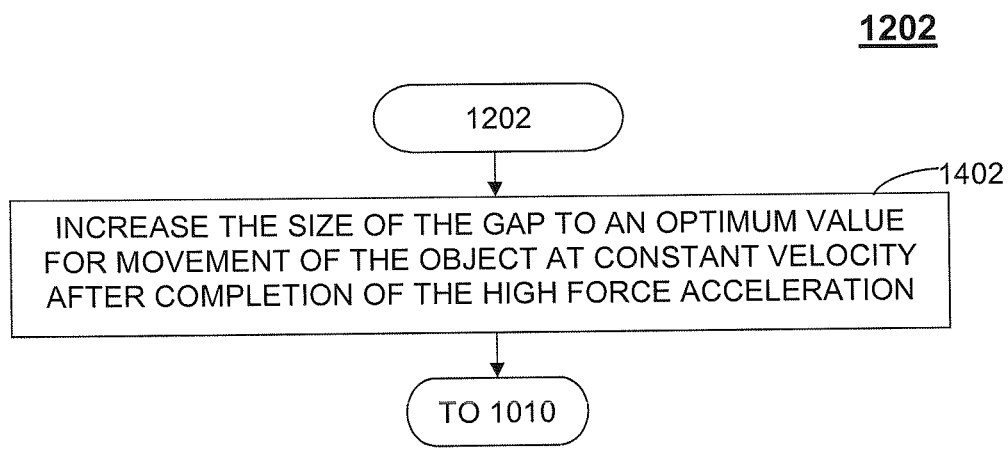

FIG. 12 is a flowchart depicting an optional further step of the method shown in FIG. 10 according to an embodiment of the present invention. In step 1202, a size of a gap between a core and a flux carrying bar of a corresponding reluctance motor is adjusted in accordance with respective movement events of the object. For example, in one embodiment, the size of the gap is decreased to an optimum value prior to high force acceleration of the object, as shown in step 1302 of the flowchart depicted in FIG. 13. In another embodiment, the size of the gap is increased to an optimum value for movement of the object at constant velocity after completion of the high force acceleration as shown in step 1402 of the flowchart depicted in FIG. 14.

Figure 15:
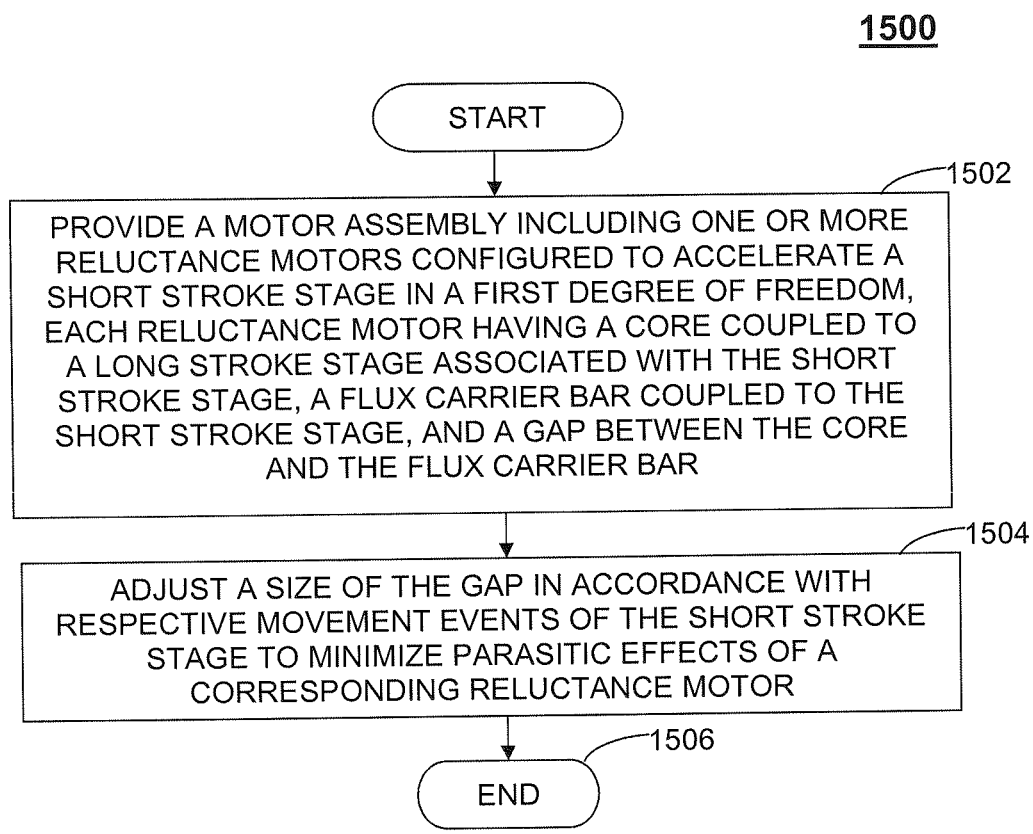
FIG. 15 is a flowchart depicting a method of positioning a short stroke stage of a lithographic apparatus according to an embodiment of the present invention.

FIG. 15 is a flowchart depicting a method 1500 of positioning a short stroke stage of a lithographic apparatus according to an embodiment of the present invention. In step 1502, a motor assembly is provided, the motor assembly including one or more reluctance motors configured to accelerate a short stroke stage in a first degree of freedom. Each reluctance motor includes a core coupled to a long stroke stage associated with the short stroke stage, a flux carrier bar coupled to the short stroke stage, and a gap between the core and the flux carrier bar. In step 1504, a size of the gap is adjusted in accordance with respective movement events of the short stroke stage to minimize parasitic effects of a corresponding reluctance motor. Method 1500 then ends.

Figure 16:
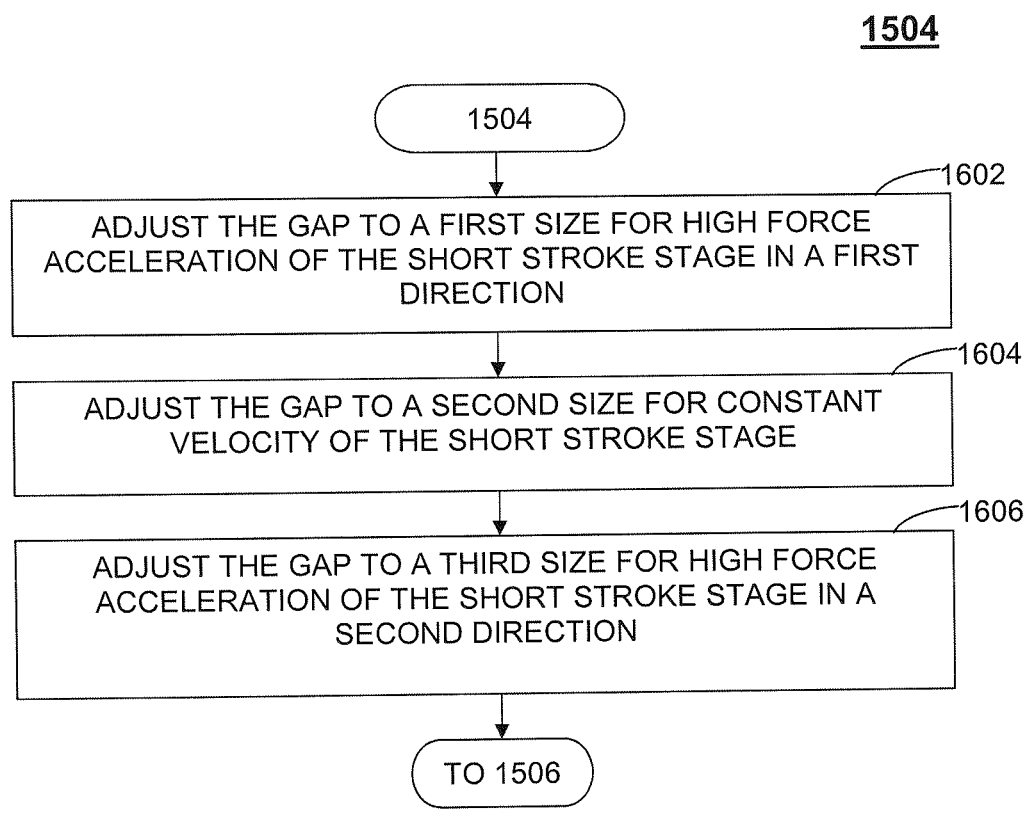
FIG. 16 is a flowchart further describing step 1506 according to an embodiment of the present invention.

FIG. 16 is a flowchart further describing step 1506 according to an embodiment of the present invention. In step 1602, the gap is adjusted to a first size for high force acceleration of the short stroke stage in a first direction. In step 1604, the gap is adjusted to a second size for constant velocity of the short stroke stage. In step 1606, the gap is adjusted to a third size for high force acceleration of the short stroke stage in a second direction. The method then continues at step 1508.

Figure 17:
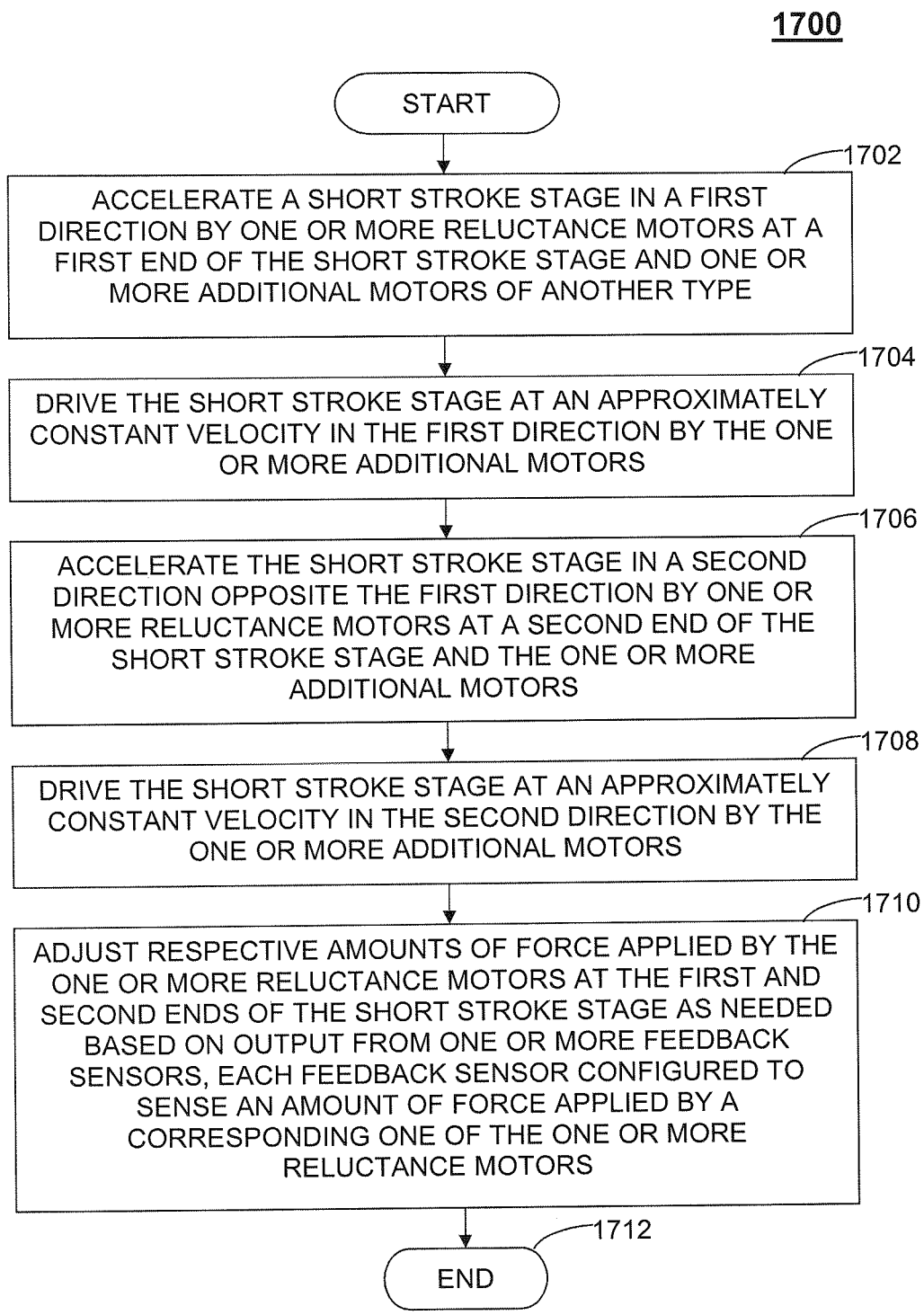
FIG. 17 is a flowchart depicting a method of positioning a short stroke stage of a lithographic apparatus according to an embodiment of the present invention.

FIG. 17 is a flowchart depicting a method 1700 of positioning a short stroke stage of a lithographic apparatus according to an embodiment of the present invention. In step 1702, a short stroke stage is accelerated in a first direction by one or more reluctance motors at a first end of the short stroke stage and one or more additional motors of another type. In step 1704, the short stroke stage is driven at an approximately constant velocity in the first direction by the one or more additional motors. In step 1706, the short stroke stage is accelerated in a second direction opposite the first direction by one or more reluctance motors at a second end of the short stroke stage and the one or more additional motors. In step 1708, the short stroke stage is driven at an approximately constant velocity in the second direction by the one or more additional motors. In step 1710, respective amounts of force applied by the one or more reluctance motors at the first and second ends of the short stroke stage are adjusted as needed based on output from one or more feedback sensors, each feedback sensor configured to sense an amount of force applied by a corresponding one of the one or more reluctance motors. Method 1700 then ends.

Figure 18:
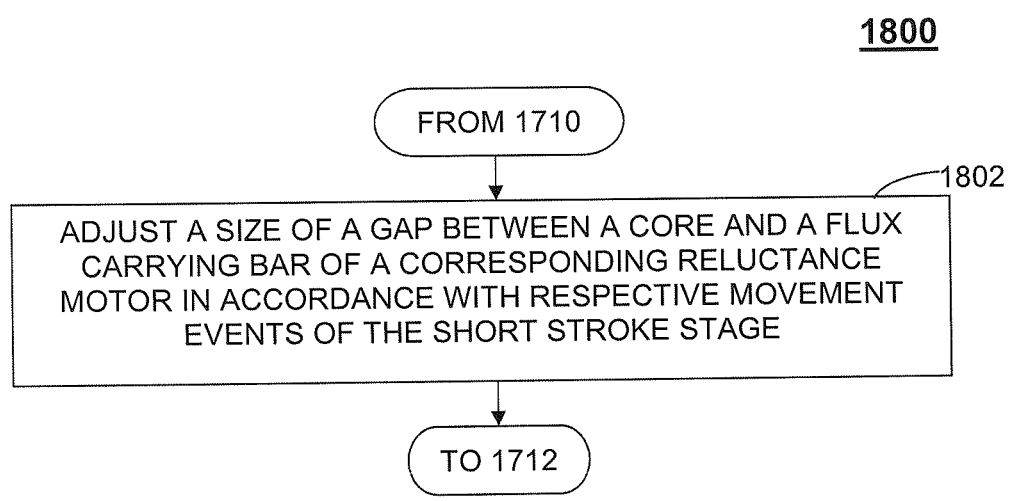
FIG. 18 is a flowchart depicting an optional further step of the method shown in FIG. 17 according to an embodiment of the present invention.

FIG. 18 is a flowchart depicting an optional further step of the method shown in FIG. 17 according to an embodiment of the present invention. In step 1802, a size of a gap between a core and a flux carrying bar of a corresponding reluctance motor is adjusted in accordance with respective movement events of the short stroke stage. For example, in one embodiment, the size of the gap is decreased to an optimum value prior to high force acceleration of the short stroke stage. In another embodiment, the size of the gap is increased to an optimum value for movement of the short stroke stage at constant velocity after completion of the high force acceleration.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A control system for controlling a positioning device displaceable in a degree of freedom via at least one reluctance motor, the control system comprising:
   at least one force sensing element configured to sense an amount of force applied by a corresponding reluctance motor; and
   a controller configured to:
      apply a first adjustment to the amount of force applied by the corresponding reluctance motor based on output from a corresponding force sensing element, and
      apply a second adjustment to adjust a size of a gap between a core and a flux carrying bar of the corresponding reluctance motor, wherein the second adjustment sets the size of the gap to a first distance in accordance with a first acceleration of the positioning device and sets the size of the gap to a second distance in accordance with a second acceleration of the positioning device.

2. The control system of claim 1, wherein the controller is configured to:

receive one or more control signals, including a signal representing the amount of force applied by the corresponding reluctance motor from the corresponding force sensing element;

obtain an acceleration trajectory plan associated with a velocity trajectory plan for the positioning device;

obtain a force trajectory plan associated with the acceleration trajectory plan;

compare the amount of force applied by the corresponding reluctance motor with a required amount of force obtained from the force trajectory plan; and adjust the amount of force applied by the corresponding reluctance motor based on the comparison to obtain a desired force.

3. The control system of claim 2, wherein the controller is configured to adjust the amount of force by adjusting a current supplied to the corresponding reluctance motor.

4. The control system of claim 2, wherein the controller is further configured to:

repeat the receiving, obtaining an acceleration trajectory plan, obtaining a force trajectory plan, comparing, and adjusting as needed to maintain the desired force.

5. The control system of claim 1, wherein the control system and positioning device are part of a lithography apparatus.

6. The control system of claim 1, wherein the at least one force sensing element comprises at least one of a piezo ceramic and a strain gauge.

7. The control system of claim 1, further comprising a position control loop.

8. A lithography apparatus comprising:

an illumination system configured to condition a radiation beam;

a patterning device stage constructed to support a patterning device, the patterning device being capable of imparting the radiation beam with a pattern in its cross-section to form a patterned radiation beam;

a substrate stage constructed to hold a substrate;

a projection system configured to project the patterned radiation beam onto a target portion of the substrate; and a positioning system configured to control a position of a short stroke module configured to hold one of the substrate or the patterning device in at least a first degree of freedom, the positioning system including a first motor assembly including one or more reluctance motors configured to move the short stroke module in the first degree of freedom;

a second motor assembly including one or more motors of a second type configured to move the short stroke module in the first degree of freedom; and a control system for controlling at least the first motor assembly, the control system including:

at least one force sensing element configured to sense an amount of force applied by a corresponding reluctance motor; and a controller configured to:

apply a first adjustment to the amount of force applied by the corresponding reluctance motor based on output from a corresponding force sensing element, and apply a second adjustment to adjust a size of a gap between a core and a flux carrying bar of the corresponding reluctance motor, wherein the second adjustment sets the size of the gap to a first distance in accordance with a first acceleration of the positioning system and sets the size of the gap to a second distance in accordance with a second acceleration of the positioning system.

9. The lithography apparatus of claim 8, wherein the controller is configured to adjust the amount of force by adjusting a current supplied to the corresponding reluctance motor.

10. The lithography apparatus of claim 8, wherein the control system further comprises a position control loop.

11. A method of positioning a movable object in a first degree of freedom, the method comprising:

providing a motor assembly including one or more reluctance motors configured to accelerate the movable object in the first degree of freedom;

providing at least one feedback signal representative of an amount of force applied by the motor assembly;

providing a first control signal to adjust the amount of force applied by the motor assembly based on the at least one feedback signal; and providing a second control signal to adjust a size of a gap between a core and a flux carrying bar of a corresponding reluctance motor, wherein the second adjustment sets the size of the gap to a first distance in accordance with a first acceleration of the movable object and sets the size of the gap to a second distance in accordance with a second acceleration of the movable object.

12. The method of claim 11, further comprising:

providing a controller configured to determine the first and second control signals.

13. The method of claim 11, wherein the controller determines the first control signal by:

obtaining an acceleration trajectory plan associated with a velocity trajectory plan for the object;

obtaining a force trajectory plan associated with the acceleration trajectory plan for the object;

comparing the amount of force applied by the motor assembly with a required amount of force obtained from the force trajectory plan; and determining a force adjustment based on the comparison to be provided via the first control signal.

14. The method of claim 11, wherein the providing the first control signal includes providing at least one current adjustment signal to adjust an amount of current provided to at least one of the one or more reluctance motors.

15. A method of positioning a short stroke stage of a lithographic apparatus in a first degree of freedom, the method comprising:

providing a motor assembly including one or more reluctance motors configured to accelerate the short stroke stage in the first degree of freedom, each reluctance motor having a core coupled to a long stroke stage associated with the short stroke stage, a flux carrier bar coupled to the short stroke stage, and a gap between the core and the flux carrier bar;

providing a first adjustment to the acceleration applied by the corresponding reluctance motor; and providing a second adjustment to adjust a size of the gap to minimize parasitic effects of a corresponding reluctance motor, wherein the second adjustment sets the size of the gap to a first distance in accordance with a first acceleration of the short stroke stage and sets the size of the gap to a second distance in accordance with a second acceleration of the short stroke stage.

16. The method of claim 15, wherein the providing a second adjustment to the size of the gap comprises:

adjusting the gap to a first size for high force acceleration of the short stroke stage in a first direction;

adjusting the gap to a second size for constant velocity of the short stroke stage; and adjusting the gap to a third size for high force acceleration of the short stroke stage in a second direction.

17. A method of positioning a short stroke stage of a lithographic apparatus in a first degree of freedom, the method comprising:

accelerating the short stroke stage in a first direction with one or more reluctance motors at a first end of the short stroke stage and one or more additional motors of another type;

driving the short stroke stage at an approximately constant velocity in the first direction with the one or more additional motors;

accelerating the short stroke stage in a second direction opposite the first direction with one or more reluctance motors at a second end of the short stroke stage and the one or more additional motors;

driving the short stroke stage at an approximately constant velocity in the second direction with the one or more additional motors;

providing a first adjustment to respective amounts of force applied by the one or more reluctance motors at the first and second ends of the short stroke stage as needed based on output from one or more feedback sensors to sense an amount of force applied by a corresponding one of the one or more reluctance motors, and providing a second adjustment to adjust a size of a gap between a core and a flux carrying bar of a corresponding reluctance motor to minimize parasitic effects of a corresponding reluctance motor, wherein the second adjustment sets the size of the gap to a first distance in accordance with the acceleration of the short stroke stage in the first direction and sets the size of the gap to a second distance in accordance with the acceleration of the short stroke stage in the second direction.

* * * * *